(12) United States Patent
Segond

(10) Patent No.: US 11,751,324 B2
(45) Date of Patent: Sep. 5, 2023

(54) ELECTRONIC CARD COMPRISING A FIRST GROUND PLANE AND A SECOND GROUND PLANE

(71) Applicant: SAFRAN ELECTRONICS & DEFENSE, Paris (FR)

(72) Inventor: Thierry Segond, Moissy-Cramayel (FR)

(73) Assignee: SAFRAN ELECTRONICS & DEFENSE, Boulogne Billancourt (FR)

( * ) Notice: Subject to any disclaimer, the term of this patent is extended or adjusted under 35 U.S.C. 154(b) by 0 days.

(21) Appl. No.: 17/771,240

(22) PCT Filed: Oct. 16, 2020

(86) PCT No.: PCT/EP2020/079202
§ 371 (c)(1),
(2) Date: Apr. 22, 2022

(87) PCT Pub. No.: WO2021/078647
PCT Pub. Date: Apr. 29, 2021

(65) Prior Publication Data
US 2022/0418096 A1    Dec. 29, 2022

(30) Foreign Application Priority Data
Oct. 23, 2019  (FR) ...................................... 1911859

(51) Int. Cl.
*H05K 1/02* (2006.01)
(52) U.S. Cl.
CPC . *H05K 1/0259* (2013.01); *H05K 2201/09354* (2013.01)

(58) Field of Classification Search
CPC ............... H05K 1/0259; H05K 1/0215; H05K 2201/09363; H02H 9/046; H02H 9/04; H01L 27/0255; H01L 27/0259; H01L 27/0266; H01C 7/12; H01C 8/04
USPC .................................................. 361/56, 91.1
See application file for complete search history.

(56) References Cited

U.S. PATENT DOCUMENTS

| | | | |
|---|---|---|---|
| 5,991,164 A | 11/1999 | Saito et al. | |
| 6,573,567 B1 * | 6/2003 | Nishizawa | H01L 23/60 257/E23.176 |
| 11,444,455 B2 * | 9/2022 | Worley | H01L 29/8605 |
| 2011/0013369 A1 | 1/2011 | Lin | |
| 2011/0242721 A1 | 10/2011 | Chen et al. | |
| 2011/0242741 A1 | 10/2011 | Wang et al. | |
| 2011/0292552 A1 | 12/2011 | Chen et al. | |

(Continued)

*Primary Examiner* — Danny Nguyen
(74) *Attorney, Agent, or Firm* — Muncy, Geissler, Olds & Lowe, P.C.

(57) ABSTRACT

An electronic card comprising: a first card portion including lightning protection components, a first ground plane and a first ground zone; a second card portion comprising functional components, a second ground plane and a second ground zone; a third card portion, which separates and electrically isolates the first ground plane and the first ground zone from the second ground plane and from the second ground zone; the first ground zone and the second ground zone being unvarnished; the first ground zone and the second ground zone being arranged in order to be applied onto a housing element that is electrically conductive and that belongs to a housing in which the electronic card is integrated.

10 Claims, 4 Drawing Sheets

(56) References Cited

U.S. PATENT DOCUMENTS

2016/0359316 A1 12/2016 Yang et al.
2017/0054382 A1 2/2017 Sugisawa

* cited by examiner

ELECTRONIC CARD COMPRISING A FIRST GROUND PLANE AND A SECOND GROUND PLANE

The invention relates to the field of electronic cards which comprise lightning protection components.

BACKGROUND OF THE INVENTION

Modern aircrafts comprise a large number of embedded systems which integrate electronic equipment such as computers, controller, data concentrators, etc. This electronic equipment comprise both "functional" components, which enable them to implement the functions for which they are provided, and "protective" components, which protect the electronic equipment from interferences that they are likely to suffer: electromagnetic interferences, lightning, etc.

At the time of manufacturing such an electronic equipment, it must be verified in the factory that the lightning protection components, for example TVS (Transient Voltage Suppressor) diodes, are correctly mounted. Therefore, test pulse voltages are applied via a test connector to the pins of the connectors of the electronic equipment. However, if the functional components and the lightning protection components are mounted on one same electronic card, it is impossible to carry out this test effectively as, in the absence of lightning protection components, these are ESD (Electrostatic Discharge) protections included in the integrated circuits that will "clamp" at the same voltages (i.e. that will let currents escape to the ground), which will produce erroneous test results.

To resolve this problem, it has been considered to separate the ground plane of one same layer into two separate ground zones on the layer. The protective components are located at one of the ground zones and the functional components at the other of the ground zones. Once the tests are carried out, the two ground zones are short-circuited with resistances of 0 ohms.

This solution is not satisfactory.

Indeed, resistances of 0 ohms form a short-circuit which is effective at a low frequency, but not at a high frequency. In addition, resistances of 0 ohms can create a slit effect in the ground plane. Moreover, this solution complexifies the implementation of the test. If the electronic card is provided for the test with resistances of 0 ohms mounted, these must be removed for the test, then remounted on the electronic card after the test.

The solution conventionally used to resolve this problem consists of integrating, in the electronic equipment, an electronic card called "backplane", which comprises the lightning protection components, and a functional card which comprises the functional components.

The presence of the lightning protection components is tested, while the backplane card is not located in the housing of the electronic equipment. The ground reference of the lightning protection components is thus different from that of the functional components and the test can be carried out effectively.

However, this solution requires two separate electronic cards, which increases the volume (and in particular the height) of the housing of the electronic equipment, as well as the cost of the electronic equipment.

Object of the Invention

The invention aims to reduce the volume and the cost of an electronic equipment comprising lightning protection components.

SUMMARY OF THE INVENTION

In view of achieving this aim, an electronic card is proposed, comprising:
a first card portion comprising lightning protection components, a first ground plane and at least one first ground zone connected to the first ground plane;
a second card portion comprising functional components, a second ground plane and at least one second ground zone connected to the second ground plane;
a third card portion which separates and electrically isolates the first ground plane and the first ground zone of the second ground plane and the second ground zone;
the first ground zone and the second ground zone being unvarnished and belonging to one same outer layer of the electronic card,
the first ground zone and the second ground zone being arranged in order to be applied onto a housing element that is electrically conductive, and that belongs to a housing in which the electronic card can be integrated, such that this housing element connects together the first ground zone and the second ground zone, and therefore the first ground plane and the second ground plane.

Thus, prior to the integration of the electronic card in the housing of the electronic equipment, the first ground plane of the first card portion and the second ground plane of the second card portion are isolated by the third card portion. The presence test of the lightning protection components can therefore be carried out on the electronic card, without the functional components interfering with the results of this test. Then, following the test, the electronic card is integrated in the housing and the housing element connects together the first ground plane and the second ground plane. The short-circuit is therefore made over the whole surface of the first ground zone and over the whole surface of the second ground zone, which can be large. The short-circuit is therefore very effective at all frequencies and does not require the use of resistances of 0 ohms. This solution makes it possible to mount on one same electronic card, the lightning protection components and the functional components, such that the backplane card dedicated to the lightning protection components is no longer necessary. From this, the cost of the electronic equipment is reduced, but also and particularly the volume of the housing which makes it possible to design an "extra flat" electronic equipment.

The invention will be best understood in the light of the description below of particular, non-limiting embodiments of the invention.

BRIEF DESCRIPTION OF THE DRAWINGS

Reference will be made to the appended drawings, among which.

DETAILED DESCRIPTION OF THE INVENTION

The electronic card according to the invention is here intended to be integrated in a housing of an electronic equipment of an aircraft embedded system.

Figure 1:
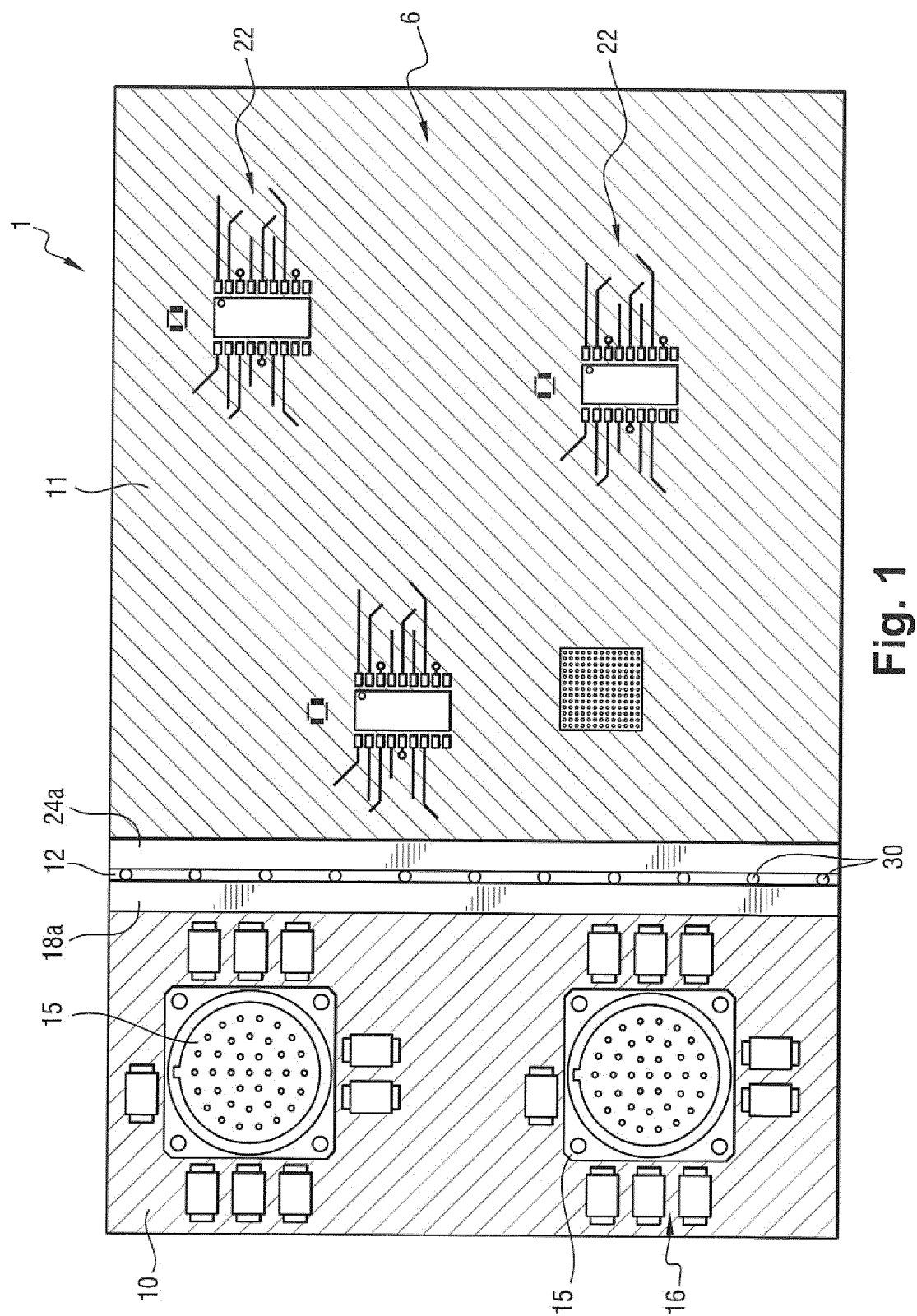
FIG. 1 is a top view of an electronic card according to a first embodiment of the invention.
Figure 2:
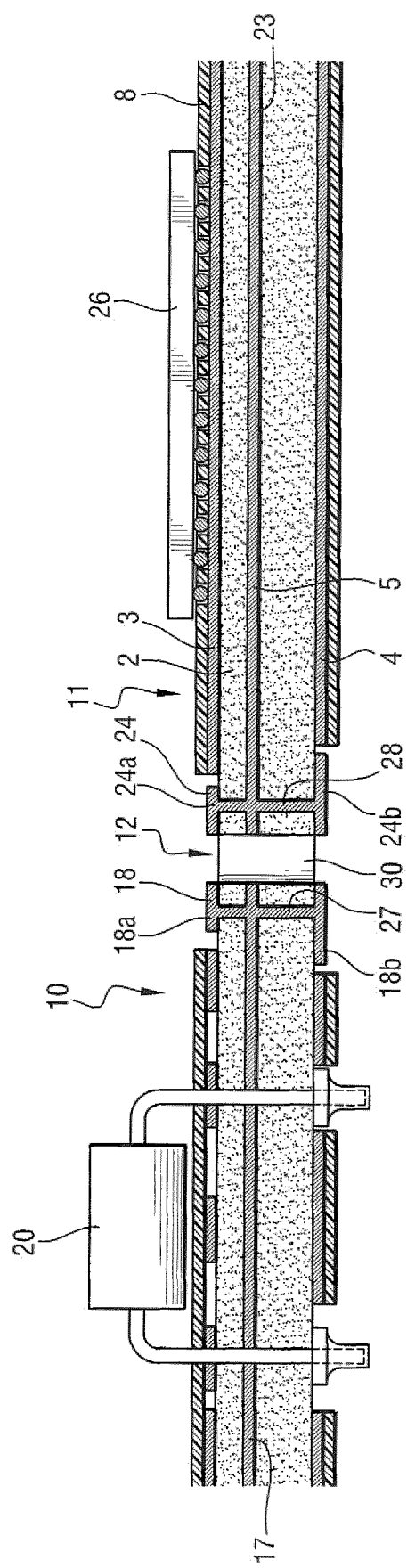
FIG. 2 is a cross-sectional view according to a plane perpendicular to the faces of the electronic card, the electronic card not being integrated in its housing.
Figure 3:
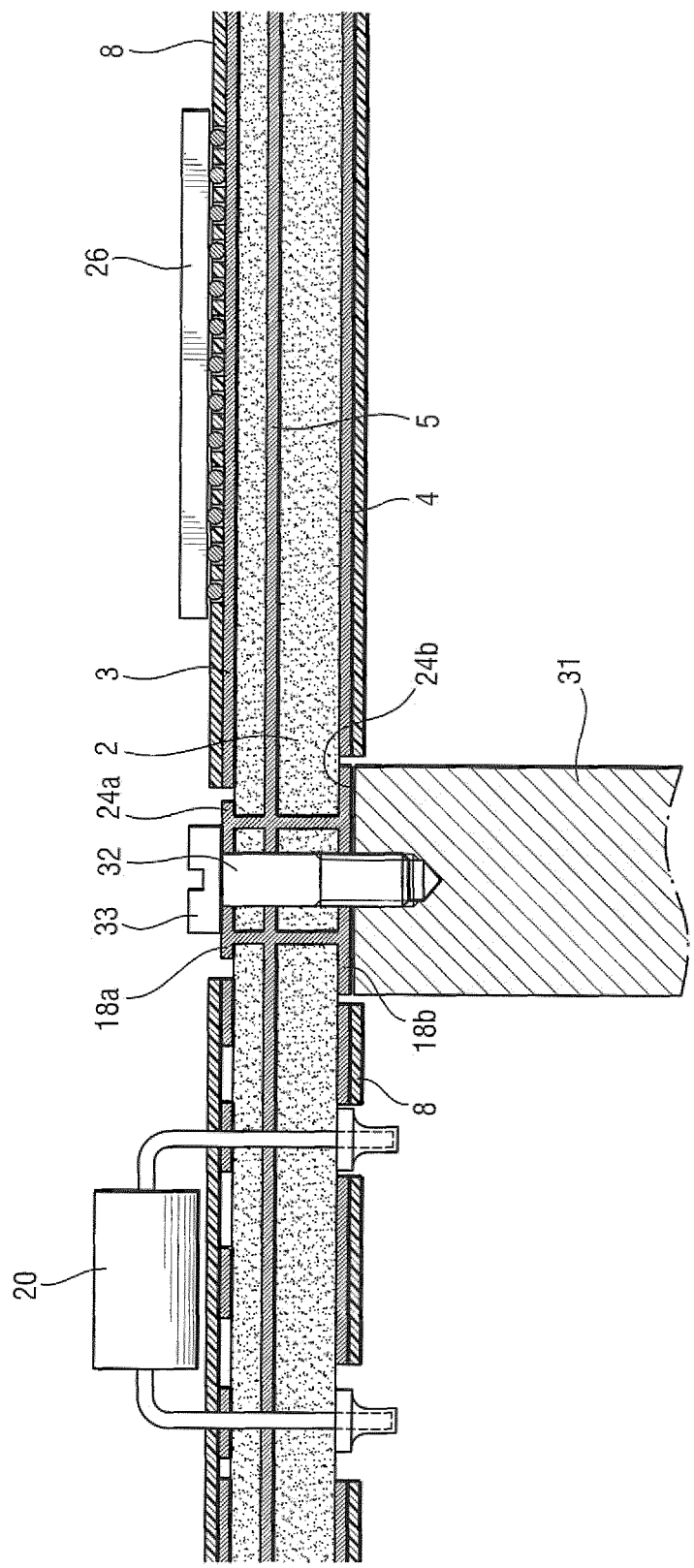
FIG. 3 is a view similar to that of FIG. 2, the electronic card being integrated in the housing.

In reference to FIGS. 1 to 3, the electronic card according to a first embodiment of the invention 1 comprises a printed circuit, which comprises an isolating material 2, as well as a first outer layer 3, a second outer layer 4 and an inner layer 5, of which all three of them are copper layers.

The isolating material 2 comprises, for example, a glass fibre frame, impregnated with epoxy resin.

The first outer layer 3, which extends here over an upper face 6 of the electronic card 1, and the second outer layer 4, which extends over a lower face of the electronic card 1, are both partially covered by a solder mask 8.

The electronic card 1 comprises three separate card portions: a first card portion 10, a second card portion 11 and a third card portion 12. Each card portion has, as a surface, a portion of the surface of the upper face 6 and therefore of the lower face of the electronic card 1, and as a thickness, the thickness of the electronic card 1.

The first card portion 10 comprises two connectors 15, protective components comprising lightning protection components 16, a first ground plane 17 and two first ground zones 18a, 18b connected to the first ground plane 17.

The lightning protection components 16 comprise in particular a through diode 20, positioned on the upper face of the electronic card 1 and the lugs of which pass through the first outer layer 3, the inner layer 5, the second outer layer 4 and the isolating material 2 to be fixed by soldering on the second outer layer 4.

The second card portion 11 comprises functional components 22, a ground plane 23 and two outer ground zones 24a and 24b connected to the second ground plane 23. The functional components 22 in particular comprise a component 26 as a BGA housing which is fixed by soldering on the first outer layer 3 of the electronic card 1.

The first ground plane 17 extends over all of the surface of the first card portion 10. The second ground plane 23 extends over all of the surface of the second card portion 11. The first ground plane 17 and the second ground plane 23 both belong to the inner layer 5 of the electronic card 1.

One of the first two ground zones 18a and one of the second two ground zones 24a both belong to the first outer layer 3 of the electronic card 1. The other of the two first ground zones 18b and the other of the two second ground zones 24b both belong to the second outer layer 4 of the electronic board 1.

The first ground plane 17 is connected to the two first ground zones 18a, 18b by first vias 27. The second ground plane 23 is connected to the two second ground zones 24a, 24b by second vias 28.

Each first ground zone 18 is a first copper strip. Each second ground zone 24 is a second copper strip.

The two first ground zones 18a, 18b and the two second ground zones 24a, 24b are bare, i.e. unvarnished.

The third card portion 12, itself, does not comprise any copper, but only the isolating material 2. The third card portion 12 extends into the whole thickness of the electronic card 1.

As can be seen in FIG. 1, when the electronic card 1 is seen from above, i.e. opposite to the upper face 6 of the electronic card 1, the third card portion 12 has the shape of a third strip which extends linearly into the whole width of the electronic card 1. This is also the case, when the electronic card 1 is seen from below.

The third card portion 12 extends between the first card portion 10 and the second card portion 11, which are therefore defined in the length of the electronic card 1 on either side of the third card portion 12.

The third card portion 12 separates and electrically isolates the first card portion 10 from the second card portion 11 and, in particular, separates and isolates the first ground plane 17 and the two first ground zones 18a, 18b, from the second ground plane 23 and from the two second ground zones 24a, 24b.

The first ground zone 18a and the second ground zone 24a therefore form the edges of the first outer layer 3 on either side of the third card portion 12. Likewise, the first ground zone 18b and the second ground zone 24b therefore form the edges of the second outer layer 4 on either side of the third card portion 12.

When the electronic card 1 is seen from above, the first strip of the first ground zone 18a, the second strip of the second ground zone 24a and the third strip of the third card portion 12 extend linearly side-by-side, parallel against one another, the third strip being positioned between the first strip and the second strip. This is also the case when the electronic card 1 is seen from below.

The first two ground zones 18a, 18b and the two second ground zones 24a, 24b each have a width greater than or equal to 3 mm.

The width of the first ground zone 18a located on the first outer layer 3 is less than the width of the first ground zone 18b located on the second outer layer 4.

Likewise, the width of the second ground zone 24a located on the first outer layer 3 is less than the width of the second ground zone 24b located on the second outer layer 4.

The first ground zone 18a and the second ground zone 24a, just like the first ground zone 18b and the second ground zone 24b, are spaced apart by a distance greater than or equal to 0.8 mm, i.e. the third card portion 12 has a width greater than or equal to 0.8 mm.

Now, the implementation of the invention will be described in more detail.

At the time of manufacturing the electronic card 1, when the presence of the lightning protection components 16 must be tested, the presence tests are carried out on the "single" electronic card 1, not integrated in the housing of the electronic equipment. The first ground plane 17, which forms the ground reference for the lightning protection components 16 of the first card portion 10, and the second ground plane 23, which forms the ground reference for the functional components 22 of the second card portion 11, are electrically isolated. The distance of 0.8 mm minimum mentioned above, makes it possible to obtain an effective isolation under the maximum test pulse voltages defined by the standard RTCA DO-160 G applicable to electronic equipment in aeronautics. In this standard, the maximum amplitude of the test pulse voltages is equal to 3200V.

Then, once the lightning protection components 16 have been tested, the electronic card 1 is integrated in the housing of the electronic equipment.

It is noted that the third card portion 12 comprises holes 30 which pass through the electronic card 1, which are regularly distributed over the whole length of the third card portion 12, and which are located in the middle of the width of the third card portion 12 (i.e. in the middle of the width of the third strip when the electronic card 1 is seen from above or below).

The electronic card 1 is installed in the housing, such that the first ground zone 18b and the second ground zone 24b of the second outer layer 4 come into contact with a housing element 31 which is electrically conductive and which belong to the housing of the electronic equipment. By "belong", here this means that the housing element forms one same part with a part of the housing or is itself fixed to the housing.

Here, the housing element 31 is a metal bar, the upper face of which serves as a plane for supporting the electronic card 1. The width of the housing element 31 is at least equal to the sum of the width of the first ground zone 18b, of the width of the second ground zone 24b of the second outer layer 4, and of the width of the third card portion 12.

Then, screws 32 are inserted from the upper face of the electronic card 1 in the holes 30 made in the third card portion 12, and are screwed into tapped holes formed in the housing element 31. When a screw 32 is screwed fully, the inner surface of the head 33 of the screw 32 is in contact with the first ground zone 18a and the second ground zone 24a of the first outer layer 3. The housing element 31, as well as the screws 32 thus electrically connect together the first ground zones 18 and the second ground zones 24, and therefore the first ground plane 17 and the second ground plane 23. The ground reference of the lightning protection components 16 and the ground reference of the functional components 22 are thus common.

Figure 4:
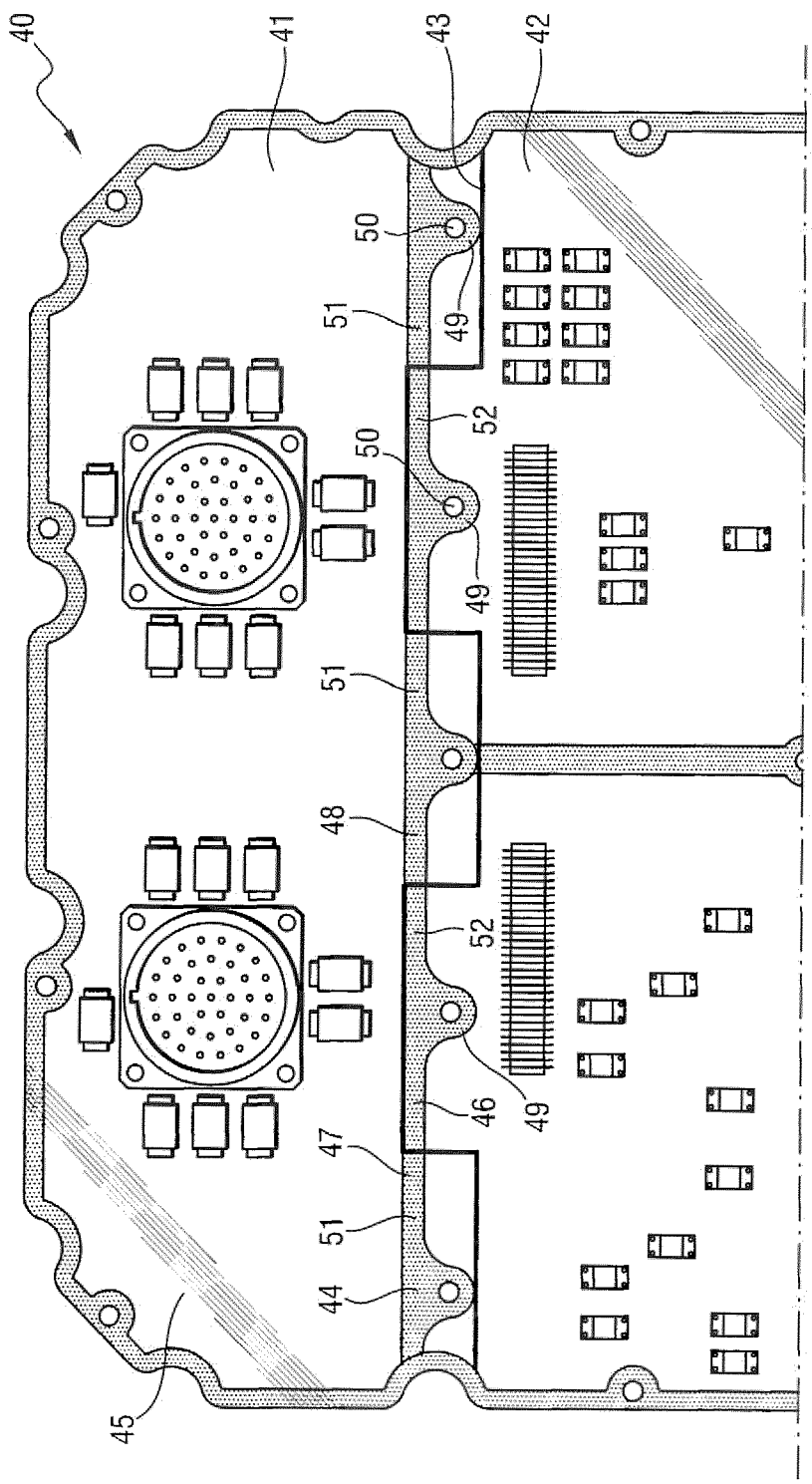
FIG. 4 is a top view of an electronic card according to a second embodiment of the invention.

In reference to FIG. 4, the electronic card according to a second embodiment 40 again comprises a first card portion 41, a second card portion 42, and a third card portion 43 which separates and electrically isolates the first card portion 41 and the second card portion 42.

The first card portion 41 comprises a first ground plane belonging to an inner layer of the electronic card 40, and a first ground zone 44 belonging to an outer layer 45 of the electronic card 40. The first ground plane and the first ground zone 44 are connected by vias.

The second card portion 42 comprises a second ground plane belonging to the inner layer of the electronic card 40, and a second ground zone 46 belonging to the outer layer 45 of the electronic card 40. The second ground plane and the second ground zone 46 are connected by vias.

The first card portion 41 comprises the lightning protection components, while the second card portion 42 comprises the functional components. The third card portion 43 has, when the electronic card 40 is seen from above, a crenellated shape which here comprises five notches (here, it is considered that, in a crenelated shape, a notch is a zone delimited by two fronts).

The outer layer 45 comprises an unvarnished ground surface 47.

The unvarnished ground surface 47 comprises a streamlined portion 48 parallel to the direction of the width of the electronic card 40 and which extends into the whole width of the electronic card 40, and excrescences 49 which extend at regular intervals from the streamlined portion 48. Each excrescence 49 comprises a fixing hole 50 intended to receive a screw.

The first ground zone 44 of the first card portion 41 comprises first portions 51 of the unvarnished ground surface 47, and the second ground zone 46 of the second card portion 42 comprises second portions 52 of the unvarnished ground surface 47, the first portions 51 of the unvarnished ground surface 47 and the second portions 52 of the unvarnished ground surface 47 being disposed alternately.

Each first portion 51 of the unvarnished ground surface 47 and each second portion 52 of the unvarnished ground surface 57 are included in a separate notch.

The first ground zone 44 of the first card portion 41 thus comprises three excrescences 49 and therefore three fixing holes 50, while the second ground zone 46 of the second card portion 42 comprises two excrescences 49 and therefore two fixing holes 50.

When the electronic card 40 is integrated in the housing, the unvarnished ground zone 47 is placed on a housing element which is electrically conductive. The electronic card is thus screwed to the housing element by screws, which extend into the fixing holes 50. The housing element short-circuits all of the unvarnished ground zone 47, and therefore the first ground zone 46, and consequently the first ground plane and the second ground plane.

Of course, the invention is not limited to the embodiments described, but comprises any variant entering into the scope of the invention, such as defined by the claims.

The invention claimed is:

1. An electronic card comprising:
a first card portion comprising lightning protection components, a first ground plane and at least one first ground zone connected to the first ground plane;
a second card portion comprising functional components, a second ground plane and at least one second ground zone connected to the second ground plane; and
a third card portion which separates and electrically isolates the first ground plane and the first ground zone from the second ground plane and the second ground zone,
wherein the first ground zone and the second ground zone is unvarnished and belonging to one same outer layer of the electronic card, and
wherein the first ground zone and the second ground zone are arranged to be applied onto a housing element which is electrically conductive and which belongs to a housing in which the electronic card can be integrated, such that this housing element connects together the first ground zone and the second ground zone, and therefore the first ground plane and the second ground plane.

2. The electronic card according to claim 1, wherein the first ground plane and the second ground plane both belong to an inner layer of the electronic card, the first ground plane and the second ground plane being connected respectively to the first ground zone and to the second ground zone by at least one first via and by at least one second via.

3. The electronic card according to claim 1, wherein, when the outer layer is seen from the front, the first ground zone has the shape of a first strip, the second ground zone has the shape of a second strip and the third card portion has the shape of a third strip, the first strip, the second strip and the third strip being parallel against one another and the third strip being located between the first strip and the second strip.

4. The electronic card according to claim 1, wherein the first ground zone and the second ground zone each have a width greater than or equal to 3 mm and the third card portion has a width greater than or equal to 0.8 mm.

5. The electronic card according to claim 1, comprising a first outer layer comprising a first ground zone and a second ground zone, and a second outer layer comprising another first ground zone and another second ground zone, the third card portion comprising at least one hole passing through the electronic card, the first ground zones and the second ground zones being arranged such that, when the electronic card is fixed to the housing element of the housing by a screw which extends into the hole, a head of the screw is in contact with the first ground zone and the second ground zone of the first outer layer, and the other first ground zone and the other second ground zone of the second outer layer are in contact with the housing element.

6. The electronic card according to claim 1, wherein the outer layer comprises an unvarnished ground surface, and wherein the first ground zone comprises first portions of the unvarnished ground surface and the second ground zone comprises second portions of the unvarnished ground surface, the first portions of the unvarnished ground surface and the second portions of the unvarnished ground surface being disposed alternately.

7. The electronic card according to claim 6, wherein, when the outer layer is seen from the front, the third card portion has a crenelated shape, each first portion of the unvarnished ground surface and each second portion of the unvarnished ground surface being included in a separate notch of the crenelated shape.

8. The electronic equipment comprising an electronic card according to claim 1 and the housing comprising the housing element, the electronic card being integrated in the housing, such that the first ground zone and the second ground zone are in contact with the housing element.

9. The electronic equipment according to claim 8, in which the housing element is a metal bar serving as stiffener or support for the electronic card.

10. A method for manufacturing an electronic equipment according to claim 8, comprising steps of:
- carrying out a test on the electronic card, intended to validate the presence of the lightning protection components, the electronic card not being integrated in the housing;
- integrating the electronic card in the housing, by putting the first ground zone and the second ground zone in contact with the housing element.

* * * * *